United States Patent
Saito

(10) Patent No.: US 7,230,444 B2
(45) Date of Patent: Jun. 12, 2007

(54) METHOD FOR MEASURING CHARACTERISTICS OF FETS

(75) Inventor: Noboru Saito, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 11/314,458

(22) Filed: Dec. 21, 2005

(65) Prior Publication Data

US 2006/0145708 A1 Jul. 6, 2006

(30) Foreign Application Priority Data

Dec. 27, 2004 (JP) .............................. 2004-375578

(51) Int. Cl.
*G01R 31/26* (2006.01)
(52) U.S. Cl. ..................................... 324/769
(58) Field of Classification Search .................... None
See application file for complete search history.

(56) References Cited

U.S. PATENT DOCUMENTS 3,965,420 A * 6/1976 Bennett ....................... 324/765
5,838,164 A * 11/1998 Chen ............................ 324/769
6,407,573 B1 * 6/2002 Yamaguchi et al. ......... 324/769

OTHER PUBLICATIONS

"Measurement of I-V Curves of Silicon-on-Insulator (SOI) MOSFET's Without Self-Heating." K.A. Jenkins et al. IEEE Electron Device Letters, vol. 16, No. 4, Apr. 1995, Abstract only.

* cited by examiner

*Primary Examiner*—Paresh Patel

(57) ABSTRACT

In an FET-characteristic measuring method, a predetermined bias voltage output from an output terminal of a bias tee is applied to the drain of an FET, and a pulse output from a pulse generator is applied to the gate thereof to thereby cause drain current to be generated. The drain current is converted by a load impedance, connected to an AC output terminal of the bias tee, into a voltage pulse, and is measured based on the voltage pulse. The method includes increasing the bias voltage by an amount corresponding to a voltage drop caused by the load impedance and repeating measurement of a value of the voltage pulse a predetermined number of times, and applying extrapolation to the last two values of the voltage-pulse values obtained by the predetermined number of repeated measurements to determine a drain voltage to be applied to the FET.

4 Claims, 7 Drawing Sheets

METHOD FOR MEASURING CHARACTERISTICS OF FETS

BACKGROUND OF THE INVENTION AND RELATED ART STATEMENT

1. Field of the Invention

The present invention relates to methods for inputting pulse signals to the gates of FETs (field-effect transistors) and measuring the IV (current-voltage) characteristics of the FETs. More specifically, the present invention relates to a method preferably used for measuring the IV characteristics of advanced FETs, such as MOSFETs (metal oxide semiconductor field-effect transistors) manufactured by SOI (silicon-on-insulator) technology or strained-silicon fabrication technology.

2. Description of the Related Art

The IV characteristic of an FET is determined by measuring a drain current flowing when a predetermined DC (direct current) voltage is applied to the gate of the FET, while a predetermined bias voltage is applied to the drain of the FET.

However, when the IV characteristics of an advanced FET, such as a MOSFET, manufactured by SOI technology or strained-silicon fabrication technology are measured, the known measuring scheme in which a DC voltage is applied to the gate of the FET (hereinafter referred to as a "device under test (DUT)") may not provide reliable measurement results of the IV characteristic, because of the self-heating phenomenon exhibited by the DUT.

Accordingly, a measuring method in which a short-duration pulse is applied to the gate of the DUT has been proposed, for example, as described in K. A. Jenkins and J. Y-C. Sun "IEEE Electron Device Letters", Vol. 16, No. 4, April 1995, p135 to 147. This method allows the semiconductor device to be operated without producing heat, thus making it possible to provide a measurement result that is not affected by heat.

In the measuring method in which the pulse is applied to the gate of the DUT, a predetermined voltage is applied to the drain of the DUT via the so-called "bias tee", so that drain current to be measured flows while the pulse is applied.

In this case, the impedance of the bias tee and the measurement unit as viewed from the DUT (i.e., the input impedance of the measurement unit) serves as a load on the DUT. Thus, when the drain current flows to the DUT, the drain voltage drops by an amount corresponding to a voltage drop caused by the load. This makes it impossible to measure the drain current under a predetermined drain voltage, which is a major cause of the measurement error of the IV characteristic. The drop in the drain voltage also restricts the range of drain voltages, and disadvantageously the IV characteristics in the necessary drain voltage range cannot be measured.

OBJECT AND SUMMARY OF THE INVENTION

Accordingly, an object of the present invention is to provide a method that is capable of accurately measuring the IV characteristics of advanced FETs, such as (SOI) MOSFETs and strained-silicon MOSFETs.

The present invention provides an FET-characteristics measuring method. In this method, a predetermined bias voltage output from the output terminal of a bias tee is applied to the drain of the FET; a pulse output from a pulse generator is applied to the gate of the FET to thereby cause drain current to be generated in the FET; the drain current is converted into a voltage pulse by a load impedance connected to the alternating-current output terminal of the bias tee; and the drain current is measured based on the voltage pulse. The method includes the step of increasing the bias voltage by an amount corresponding to a voltage drop caused by the load impedance and repeating measurement of the voltage pulse a predetermined number of times. The voltage pulse changes in response to an increase in the bias voltage. The method further includes the step of applying extrapolation to the last two measured values of the voltage pulse obtained by the predetermined number of repeated measurements to determine a drain voltage to be applied to the FET.

Preferably, the pulse output from the pulse generator is applied to the FET via an attenuator.

When the pulse generator outputs voltages having the same value for various voltage settings included in the same output-voltage-setting range due to errors associated with the resolution of voltage setting, the method may further include the steps of setting for the pulse applied to the gate of the FET a lower limit voltage while is a minimum voltage $V_{set}$-L in a first setting range including a desired set pulse voltage $V_{set}$-K and an upper limit voltage which is a minimum voltage $V_{set}$-H in a second set range adjacent to a maximum voltage in the first setting range; measuring the drain current based on a pulse having the upper limit voltage and the drain current based on a pulse having the lower limit voltage; and computing, by interpolation, a drain current corresponding to a drain current based on the desired set pulse voltage $V_{set}$-K, in accordance with the desired set pulse voltage $V_{set}$-K and each measured drain current.

The method may further include the steps of measuring the width of the pulse applied to the gate of the FET; adjusting pulse-voltage-defining timing of the applied pulse to timing shifted from a leading edge of the applied pulse toward a trailing edge thereof in a width direction by a predetermined ratio; and measuring the width of the voltage pulse. The method may further include the steps of setting a voltage-detection timing of the voltage pulse to a timing shifted from the leading edge of the voltage pulse toward the trailing edge thereof by an amount corresponding to the predetermined ratio of the width of the voltage pulse, and measuring the voltage of the voltage pulse at the voltage-detection timing.

The present invention allows the drain voltage to be appropriately determined without deteriorating the measurement throughput, thus making it possible to perform high-accuracy measurement of the IV characteristics. The present invention can also reduce the influence of drain voltage drops on the measurement values.

DETAILED DESCRIPTION OF PREFERRED EMBODIMENTS

An embodiment of the present invention will be described below with reference to the accompanying drawings.

Figure 1:
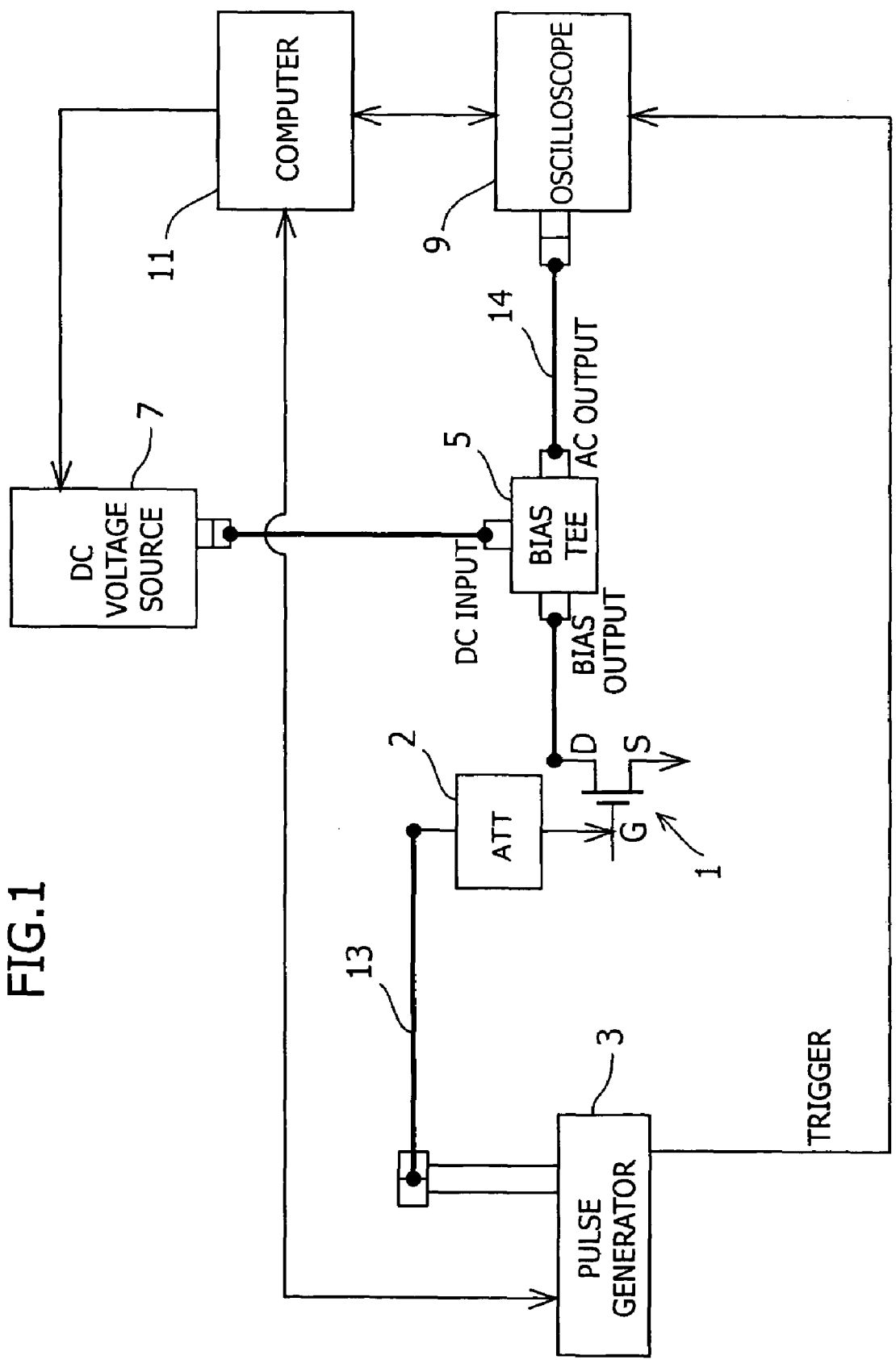
FIG. 1 is a block diagram illustrating a measurement system for realizing a measuring method according to the present invention.

Referring to FIG. 1, a DUT (device under test) 1 is a MOSFET which may be manufactured by SOI (silicon-on-insulator) technology or strained-silicon fabrication technology.

A pulse generator 3 is connected to the gate (G) of the DUT 1 via an attenuator 2, and a DC voltage source 7 and an oscilloscope 9 (which may be a digital oscilloscope) are connected to the drain (D) of the DUT 1 via a so-called "bias tee" 5.

The DC voltage source 7 may be implemented with an SMU (source measure unit) having the functions of applying highly accurate DC voltages and measuring currents with high accuracy. Examples include the SMU 4156 manufactured by Agilent Technologies Inc.

In this embodiment, the output impedance of the pulse generator 3 and the input impedance of the oscilloscope 9 are set to 50 Ω. The pulse generator 3 supplies a trigger signal (i.e., a synchronization signal) to the oscilloscope 9.

When the IV characteristic (drain current-drain voltage characteristic) of the DUT 1 is measured, prior to the measurement, correction coefficients are set for calibrating the oscilloscope 9, the input impedance of the oscilloscope 9 is measured, correction coefficients are set for calibrating the pulse generator 3, the insertion loss of the bias tee 5 is measured, losses in a cable 14 are measured between the bias tee 5 and the oscilloscope 9, the input impedance of the bias tee 5 is measured, the insertion loss of the attenuator 2 is measured, and the input impedance of the attenuator 2 is measured.

A) For the calibration of the oscilloscope 9, the SMU is connected to an input of the oscilloscope 9 with a short cable and is caused to sequentially output voltages having multiple voltage values, which are measured by the oscilloscope 9. Correction coefficients ($A_2$, $B_2$) for linearizing the relationship between voltages output from the SMU and voltages measured by the oscilloscope 9 are obtained by a least squares method. The correction coefficients ($A_2$, $B_2$) are used for calibrating the voltage $V_{mes}$ measured by the oscilloscope 9. Thus, the calibrated measurement voltage $V_{out}$ of the oscilloscope 9 is given by the following expression:

$$V_{out}=A_2 \cdot V_{mes}+B_2 \qquad (1)$$

The correction coefficients $A_2$ and $B_2$ are pre-stored in a storage unit of a computer 11.

B) For the measurement of the input impedance of the oscilloscope 9, a voltage output from the SMU is input to the oscilloscope 9, and current flowing into the oscilloscope 9 in response to the input of the voltage is measured by the SMU. The input impedance can be determined based on the voltage output from the SMU and the current measured by the SMU. The input impedance of the oscilloscope is pre-stored in the storage unit of the computer 11.

C) For the calibration of the pulse generator 3, after the oscilloscope 9 is connected to the output of the pulse generator 3 with a short cable, the pulse generator 3 is caused to output pulses having multiple voltages and the voltage of each voltage pulse is measured by the oscilloscope 9. Correction coefficients ($A_1$, $B_1$) for linearizing the relationship between a voltage $V_g$ output from the pulse generator 3 and a corresponding voltage $V_{out}$ output after the calibration of a voltage $V_{mes}$ measured by the oscilloscope 9 are obtained by a least squares method. The coefficients ($A_1$, $B_1$) are used to calibrate the voltage $V_g$ output from the pulse generator 3. Thus, the calibrated output voltage $V_g'$ of the pulse generator 3 is given by the following expression:

$$V_g'=A_1 \cdot V_g+B_1 \qquad (2)$$

The correction coefficients $A_1$ and $B_1$ are pre-stored in the storage unit of the computer 11.

D) For the measurement of the insertion loss of the bias tee 5 shown in FIG. 1, the calibrated pulse generator 3 is connected to a bias output terminal of the bias tee 5 with a short cable and an AC (alternating-current) output terminal of the bias tee 5 is connected to the oscilloscope 9 with a short cable. The insertion loss of the bias tee 5 can be obtained by determining the ratio of a signal voltage output from the pulse generator 3 and measured by the oscilloscope 9 via the bias tee 5 to a signal voltage output from the pulse generator 3 and directly measured by the oscilloscope 9 without the bias tee 5 interposed therebetween. The insertion loss of the bias tee 5 is pre-stored in the storage unit of the computer 11.

E) For the measurement of loss in the cable 14 connected between the AC output terminal of the bias tee 5 and the input of the oscilloscope 9, the pulse generator 3 is connected to one end of the cable 14 via a short cable and the oscilloscope 9 is connected to the other end of the cable 14 via a short cable. The insertion loss of the cable 14 is obtained by determining the ratio of a voltage output from the pulse generator 3 and measured by the oscilloscope 9 via the cable 14 to a voltage output from the pulse generator 3 and directly measured by the oscilloscope 9 without the cable 14 interposed therebetween. The insertion loss of the cable 14 is pre-stored in the storage unit of the computer 11.

F) The impedance between the bias output terminal and the AC output terminal of the bias tee 5 is measured by connecting the two opposite ends to a network analyzer or the like. The measured input impedance is pre-stored in the storage unit of the computer 11.

G) For the measurement of the insertion loss of the attenuator 2, first and second SMUs are connected to the input port and the output port of the attenuator 2, respectively. A voltage $V_2$ output from the attenuator 2 when a voltage $V_1$ output from the first SMU is applied to the input port of the attenuator 2 is measured by the second SMU (at this point, the output port is substantially open-circuit). The insertion loss of the attenuator 2 is found by $V_2/V_1$. The insertion loss of the attenuator 2 is pre-stored in the storage unit of the computer 11.

H) For the measurement of the input impedance of the attenuator 2, current $I_1$ input to the attenuator 2 when the voltage $V_1$ output from the first SMU is applied to the input of the attenuator 2 is measured by the first SMU (at this point, the output port is substantially open). The input impedance of the attenuator 2 is found by $V_1/I_1$. The input impedance of the attenuator 2 is pre-stored in the storage unit of the computer 11.

When the measurement system shown in FIG. 1 is used to measure the IV characteristic of the DUT 1, the output of the pulse generator 3 is connected to the gate of the DUT 1 via the cable 13 and the attenuator 2, so as to cause the output pulse (the pulse width is, for example, about 1 to 10 ns) of the pulse generator 3 to be applied to the gate of the DUT 1 via the cable 13 and the attenuator 2. Further, a DC input terminal of the bias tee 5 is connected to the output of the current voltage source 7 and the drain of the DUT 1 is connected to the bias output terminal of the bias tee 5, so as to cause a predetermined output voltage of the DC voltage source 7 to be applied to the drain of the DUT 1 via the bias tee 5. Further, the AC output terminal of the bias tee 5 is connected to the input terminal of the oscilloscope 9 via the cable 14.

At this point, under the control of the computer 11, a voltage $V_{set}$ of the pulse output from the pulse generator 3 is set as follows:

$$V_{set}=(A_1 \cdot V_g+B_1)/\text{LossATT} \quad (3)$$

where LossATT indicates the insertion loss of the attenuator 2.

The reason why the attenuator 2 is used will now be explained. The pulse output from the pulse generator 3 to the cable 13 may be reflected multiple times between the input terminal and the output terminal of the cable 13, due to a difference between the output impedance of the pulse generator 3 and the characteristic impedance of the cable 13 and a difference between the input impedance (including an impedance due to the input capacitance) of the DUT 1 and the characteristic impedance of the cable 13. The occurrence of the multiple reflections degrades the pulse quality.

With the attenuator 2, however, the attenuation effect thereof reduces the pulse reflections at the DUT 1 end of the cable 13, so that the insertion of the attenuator 2 can improve the quality of pulse applied to the DUT 1. The attenuator 2 is used for such a reason.

Figure 2:
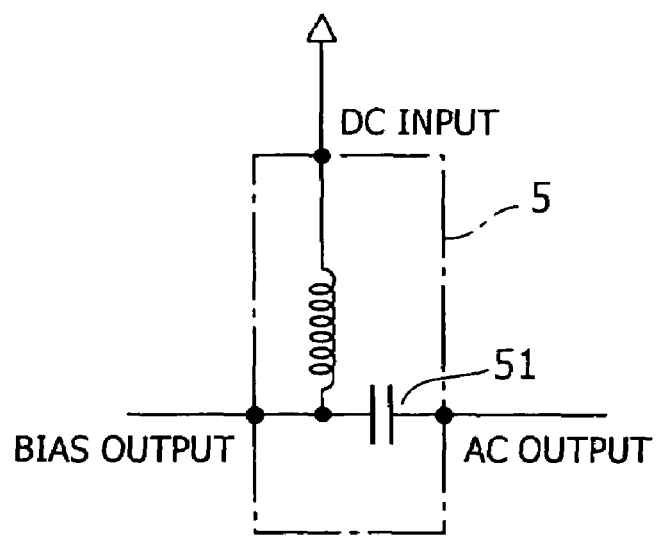
FIG. 2 is a circuit diagram showing the structure of a bias tee.

When the pulse with the voltage $V_{set}$ is input to the gate of the DUT 1 via the attenuator 2, the DUT 1 is turned on to cause current corresponding to the drain current of the DUT 1 to flow to a DC-blocking capacitor (see reference numeral 51 in FIG. 2) built into the bias tee 5. Due to the impedance when the bias tee 5 and the oscilloscope 9 are viewed from the drain of the DUT 1, the current passing through the capacitor 51 is converted into a voltage pulse corresponding to the drain current of the DUT 1. The voltage value of the converted voltage pulse is measured by the oscilloscope 9.

In terms of an AC circuit, in practice, electrical continuity is established between the bias output terminal and the AC output terminal of the bias tee 5, whereas almost no current flows between the bias output terminal and the DC input terminal because of the high impedance. Thus, the drain current is equal to the current flowing through the impedance in the oscilloscope 9.

The computer 11 computes the calibrated measurement voltage $V_{out}$ based on equation (1) illustrated above and the measurement voltage $V_{mes}$ of the oscilloscope 9, and computes a drain current $I_d$ based on the following expression:

$$I_d=\{V_{out}/(\text{Loss1} \cdot \text{Loss2})\}/Z^{in} \quad (4)$$

where Loss1 indicates the insertion loss of the cable 14, Loss2 indicates the insertion loss of the bias tee 5, and $Z_{in}$ indicates the composite impedance of the input impedance of the oscilloscope 9 and the input impedance of the bias tee 5.

Figure 3:
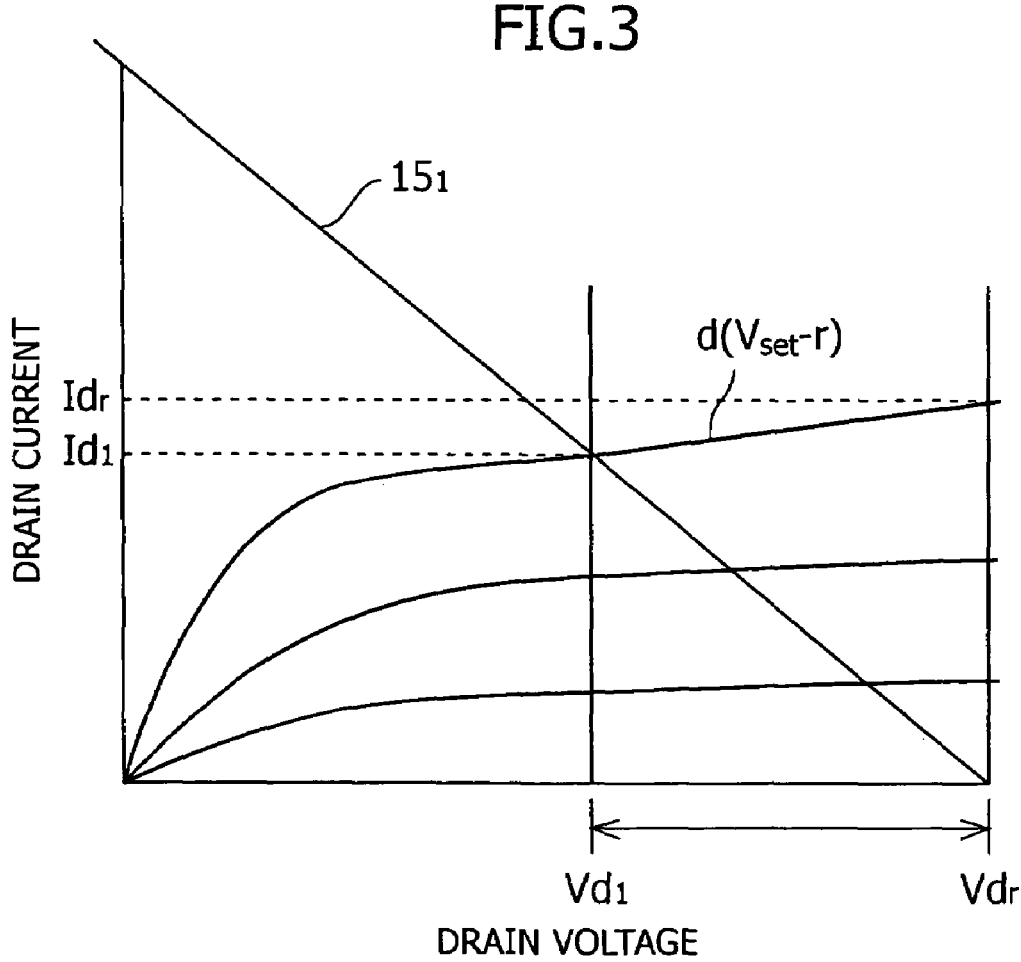
FIG. 3 is a graph showing an IV characteristic and a drain-voltage drop due to load impedance.

To obtain the IV characteristic of the DUT 1, the computer 11 controls a voltage output from the DC voltage source 7 with respect to a predetermined gate pulse voltage and measures the drain current with respect to multiple drain voltages. Similar measurement is then repeated with respect to multiple gate pulse voltages to obtain an IV characteristic, as illustrated in FIG. 3.

Figure 4:
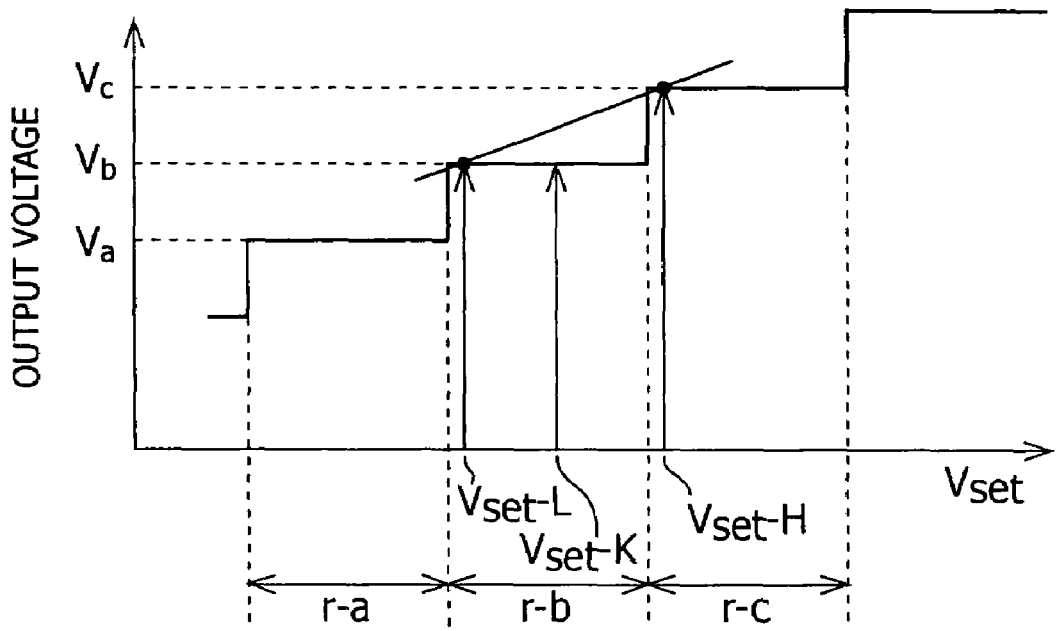
FIG. 4 is a graph illustrating a setting-voltage resolution error of a pulse generator.

Now, the setting voltage $V_{set}$ of a pulse output from the pulse generator 3 will be discussed. The pulse generator 3 does not have a voltage setting accuracy as high as that of the DC voltage source 9. That is, the pulse generator 3 outputs a voltage having the same value with respect to various setting voltages included in a setting-voltage range, as shown in FIG. 4. For example, the pulse generator 3 outputs a pulse with an output voltage $V_a$ with respect to all setting voltages included in a setting range r to a, outputs a pulse with an output voltage $V_b$ with respect to all setting voltages included in a setting range r to b, and outputs a pulse with an output voltage $V_c$ with respect to all setting voltages included in a setting range r to c. This indicates that the voltage output from the pulse generator 3 is affected by a setting-voltage resolution error.

Figure 5:
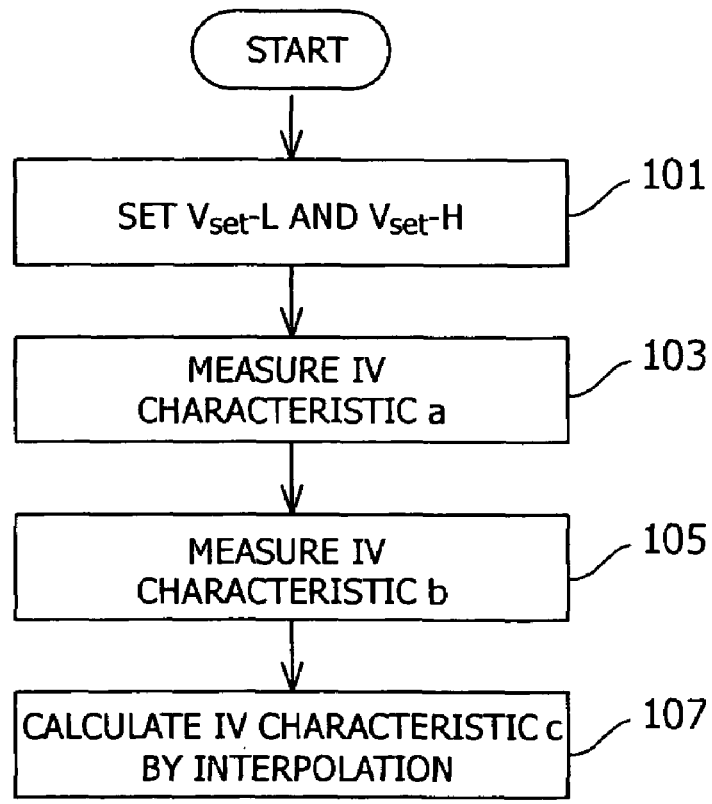
FIG. 5 is a flow chart showing a method for reducing the influence of error in the pulse generator.

Accordingly, in order to minimize the influence of the setting voltage resolution error of the pulse generator 3, the computer 11 can execute a calibration procedure as shown in FIG. 5.

In this procedure, a minimum voltage $V_{set}$-L in the setting range r–b including a desired setting pulse voltage $V_{set}$-K shown in FIG. 4 (hereinafter, the minimum voltage $V_{set}$-L will be referred to as a "lower limit voltage") and a minimum voltage $V_{set}$-H in the setting range r–c adjacent to the maximum voltage in the setting range r–b (hereinafter, the minimum voltage $V_{set}$-H will be referred to as an "upper limit voltage") are set as pulse voltages instead of the desired pulse voltage $V_{set}$-K (in step 101). When the voltage ranges r–a, r–b, and r–c are set to, for example, 0.1 V, the range of $V_a$ to $V_b$ and the range of $V_b$ to $V_c$ are also 0.1 V.

Figure 6:
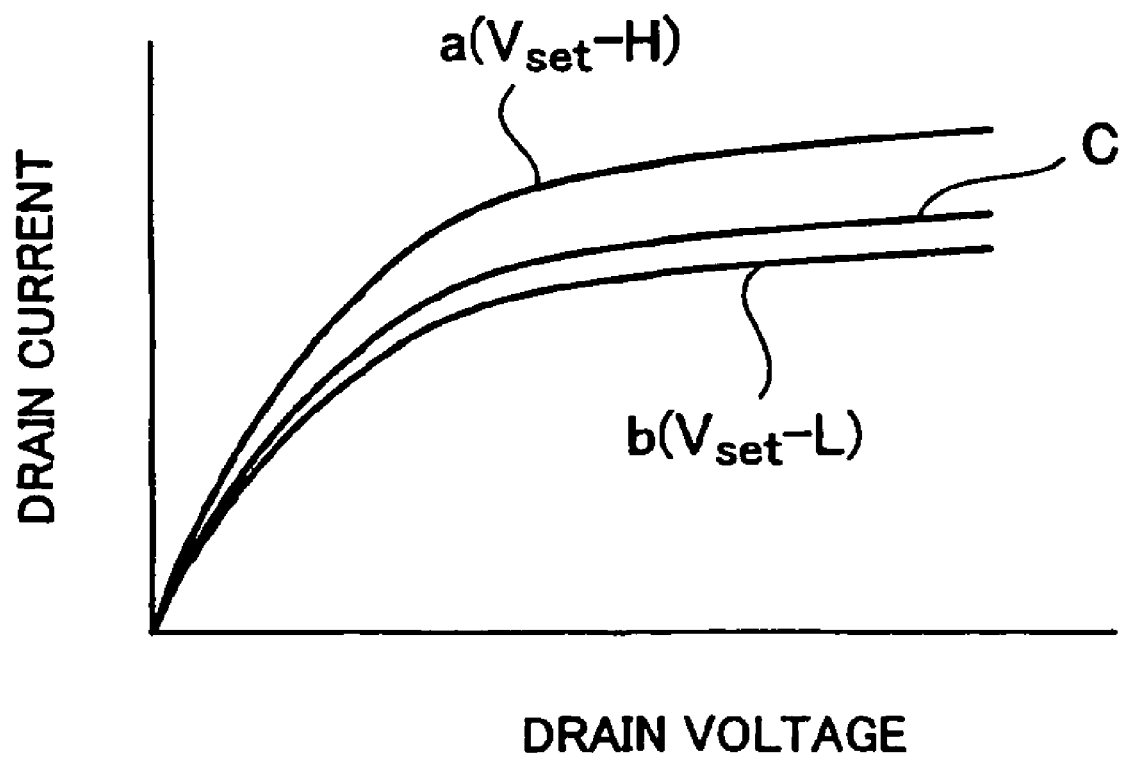
FIG. 6 is a graph showing IV characteristics obtained by the scheme illustrated in FIG. 4.

The range of the lower limit voltage $V_{set}$-L and an upper limit voltage $V_{set}$-H includes the desired pulse voltage $V_{set}$-K. Thus, pulses at the upper limit voltage $V_{set}$-H and the lower limit voltage $V_{set}$-L are output by the pulse generator 3, and an IV characteristic a and an IV characteristic b, as shown in FIG. 6, are measured (in steps 103 and 105). An IV characteristic c is calculated by interpolation, based on the IV characteristics a and b and the desired setting pulse voltage $V_{set}$-K (in step 107).

The IV characteristic c is analogous to an IV characteristic based on the desired pulse voltage $V_{set}$-K that is, an IV characteristic obtained when a pulse with the desired pulse voltage $V_{set}$-K is output by the pulse generator 3. In other words, the IV characteristic c is less affected by the setting-voltage resolution error of the pulse generator 3 and is thus highly reliable.

A method for further improving the measurement accuracy will be described next. Referring to FIG. 1, the impedance (including the input impedance 50 Ω of the oscilloscope 9) when the bias tee 5 and the oscilloscope 9 are viewed from the drain of the DUT 1 is equivalent to the load of the DUT 1. As shown in FIG. 3, this load impedance is indicated by a load line $15_1$. Thus, for example, even when the output voltage of the DC voltage source 7 is set to $Vd_r$, the actual drain voltage applied to the DUT 1 becomes $Vd_1$ (<$Vd_r$) due to a voltage drop caused by the load impedance.

Consequently, the oscilloscope 9 measures a voltage ($Vd_r$–$Vd_1$) corresponding to a drain current $Id_1$; that is, it measures a voltage corresponding to a drain current $Id_1$ that is lower than a drain current $Id_r$ that is supposed to be measured.

It is to be noted that the measurement voltage of the oscilloscope 9 in this embodiment refers to a voltage drop due to the drain current $Id_1$ flowing through the load impedance in the oscilloscope 9.

Figure 7:
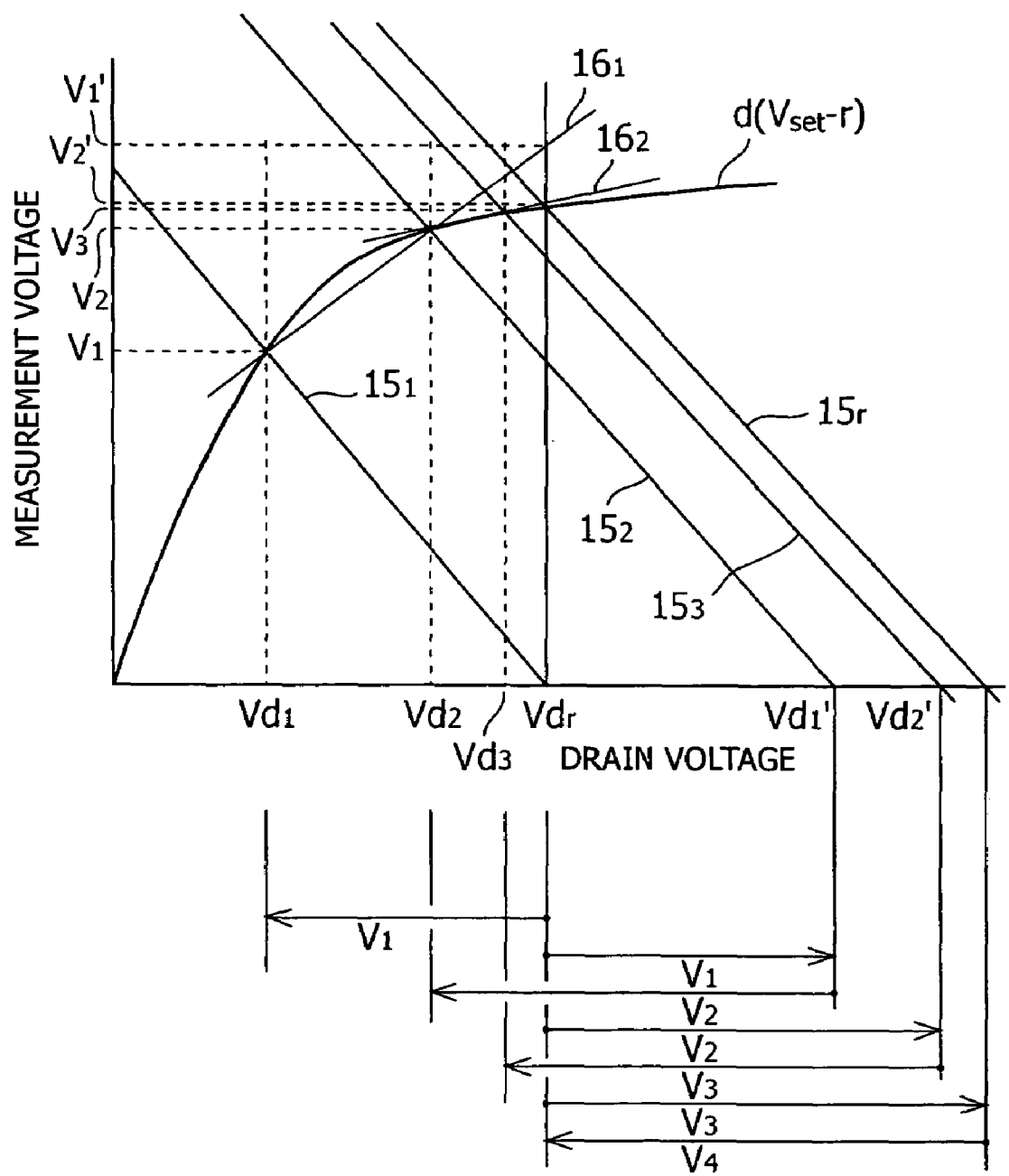
FIG. 7 is a graph showing an embodiment of the present invention.
Figure 8:
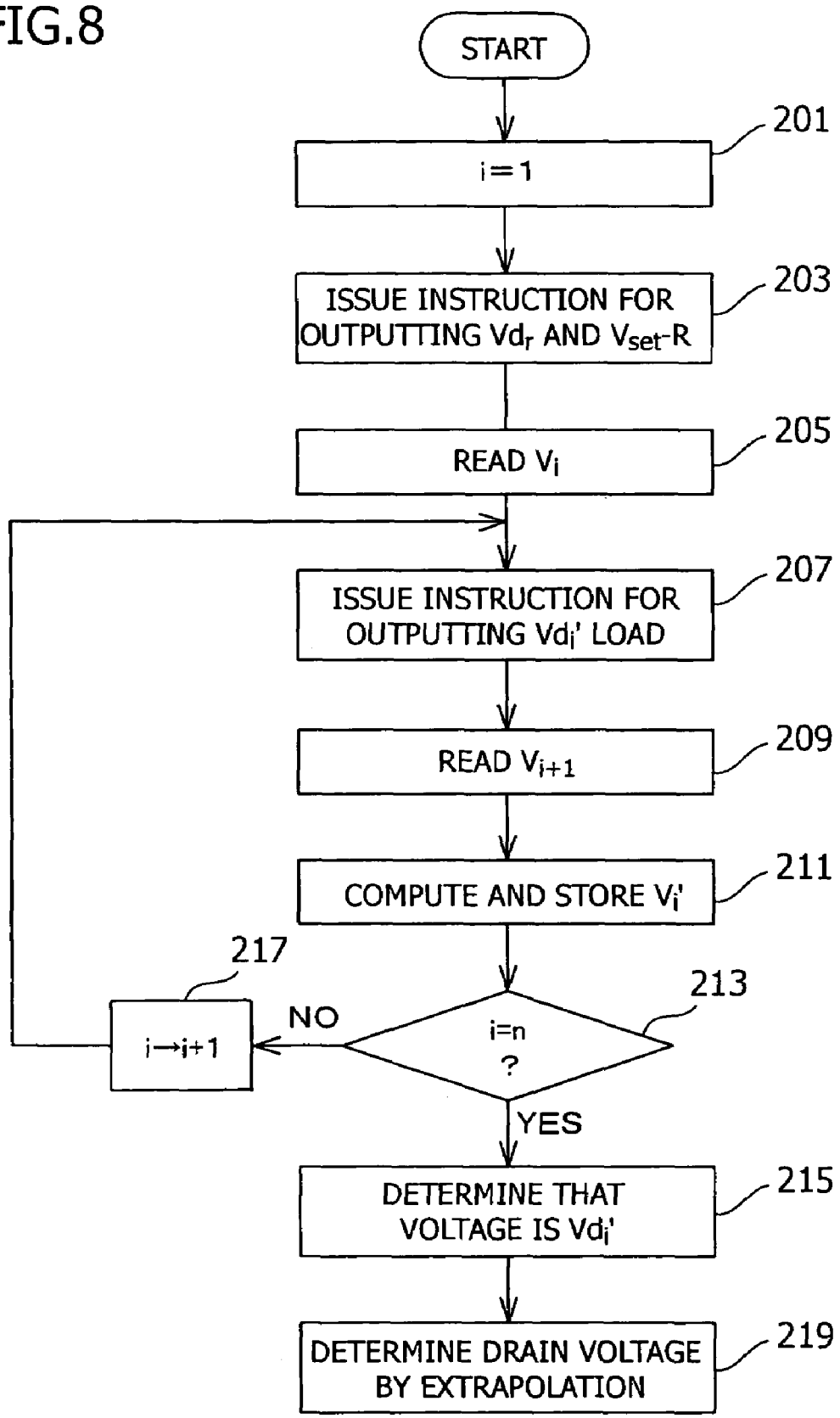
FIG. 8 is a flow chart showing the embodiment of the present invention.

FIGS. 7 and 8 show a method for avoiding the problem described above. In this embodiment, since the drain current is detected as a corresponding voltage, the vertical axis in FIG. 7 indicates the measurement voltage of the oscilloscope 9. The procedure shown in FIG. 8 is executed by the computer 11.

In the procedure shown in FIG. 8, first, numeric value i (which is an integer equal to 1 or more) is initialized to "1" (in step 201). Subsequently, an instruction for outputting the voltage $Vd_r$ is issued to the DC voltage source 7 and an instruction is issued to the pulse generator 3 such that a pulse with a voltage $V_{set}$-r is input to the gate of the DUT 1 (in step 203).

Thus, the drain voltage of the DUT 1 drops to $Vd_1$, as described above, and consequently, the oscilloscope 9 measures a voltage difference $V_1$ of a voltage drop ($Vd_r$–$Vd_1$) corresponding to the drain current. That is, the oscilloscope 9 measures the voltage difference $V_1$ corresponding to the drain current, at the bias voltage value $Vd_1$ that is lower than a voltage $V_r$ measured under the predetermined drain bias voltage $Vd_r$.

Thus, the voltage $V_1$ measured by the oscilloscope 9 is read (in step 205). A voltage $Vd_1'$ obtained by adding the voltage $V_1$ to the voltage $Vd_r$ (i.e., $Vd_1'=Vd_r+V_1=Vd_r+(Vd_r-Vd_1)$) is computed, and an instruction is issued to the DC voltage source 7 such that it outputs the voltage $Vd_1'$ (in step S207).

When the voltage $Vd_1'$ is output from the DC voltage source 7, a load based on the above-described impedance and indicated by a load line $15_2$ causes the drain voltage of the DUT 1 to drop from $Vd_1^1$ to $Vd_2$. Consequently, a voltage difference $V_2$ of a voltage drop ($Vd_1'-Vd_2$) corresponding to the drain current is measured by the oscilloscope 9 and the voltage $V_2$ is read (in step 209).

A straight line $16_1$ passing through a point at which the load line $15_1$ intersects an IV characteristic d and a point at which the load line $15_2$ intersects an IV characteristic d is expressed by equation (5) below:

$$y=\{(V_2-V_1)/(Vd_2-Vd_1)\}(x-Vd_2)+V_2 \quad (5)$$

where y and x indicate the vertical axis and the horizontal axis in FIG. 7, respectively.

In equation (5), using the known $Vd_r$ and $V_1$, $Vd_1$ can be determined by the expression $Vd_1=Vd_r-V_1$. Using the known $Vd_1'$ and $V_2$, $Vd_2$ can be determined by the expression $Vd_2=Vd_1'-V_2$. Accordingly, a value $V_1'$ of y for $x=Vd_r$ is computed in equation (5) above and the value $V_1'$ is stored in a storage unit (in step 211).

Next, a determination is made as to whether or not i is equal to n (e.g., "3") (in step 213). At this point, since the result of the determination in step 213 indicates NO, the numeric value i is incremented by "1" (in step 217) and the process returns to step 207. Thus, a voltage $Vd_2'$ that is obtained by adding the voltage $V_2$ to the voltage $Vd_r$ (i.e., $Vd_2'=Vd_r+V_2=Vd_r+(Vd_r-Vd_2)$) is computed, and an instruction is issued to the DC voltage source 7 such that the voltage $Vd_2'$ is output from the DC voltage source 7.

When the voltage $Vd_2'$ is output from the DC voltage source 7, a load based on the above-described impedance and indicated by a load line $15_3$ causes the drain voltage of the DUT 1 to drop from $Vd_2'$ to $Vd_3$. Consequently, a voltage $V_3$ corresponding to the voltage drop ($Vd_2'-Vd_3$) is measured by the oscilloscope 9 and the voltage $V_3$ is read (in step 209).

A straight line $16_2$ passing through a point at which the load line $15_2$ intersects the IV characteristic d and a point at which the load line 153 intersects the IV characteristic d is expressed by equation (6) below:

$$y=[(V_3-V_2)/(Vd_3-Vd_2)](x-Vd_3)+V_3 \quad (6)$$

In this equation, using the known $Vd_2'$ and $V_3$, $Vd_3$ can be determined by the expression $Vd_3=Vd_2'-V_3$. A value $V_2'$ of y for $x=Vd_r$ is computed in equation (6) above and the value $V_2'$ is stored in the storage unit (in step 211). Subsequently, a determination is made as to whether or not i is equal to n (in step 213).

In this example, since the result of the determination in step 213 indicates YES, it is determined that the voltage to be output from the DC voltage source 7 and to be applied to the drain voltage $Vd_r$ of the DUT 1 is $Vd_2'$, and the voltage $Vd_2'$ is stored in the storage unit (in step 215).

Next, of the n voltages $Vd_1, Vd_2, \ldots,$ and $Vd_n$ obtained until i reaches n, extrapolation is applied to the last two voltages $Vd_{n-1}$ and $Vd_n$ to determine a drain voltage to be applied (in step 219).

The point at which $X=Vd_r$ and the straight line $16_2$ shown in FIG. 7 intersect each other indicates the Vd-point drain current determined by extrapolation. In this manner, the use of the extrapolation makes it possible to accurately measure the IV characteristic without deteriorating the measurement throughput. The determination of the drain voltage, as described, makes it possible to reduce the influence of the drain voltage drop on the measurement values.

While the processing for determining one drain voltage value has been described above, processing for determining other drain voltage values required for measuring an output characteristic is similarly executed. While the drain voltage (the output voltage of the DC voltage source 7) determined by the above-described processing is obtained at a voltage of $V_{set}$-r, drain voltages with respect to other gate pulse voltages can be determined by executing processing similar to the above-described processing.

Figures 9A, 9B:
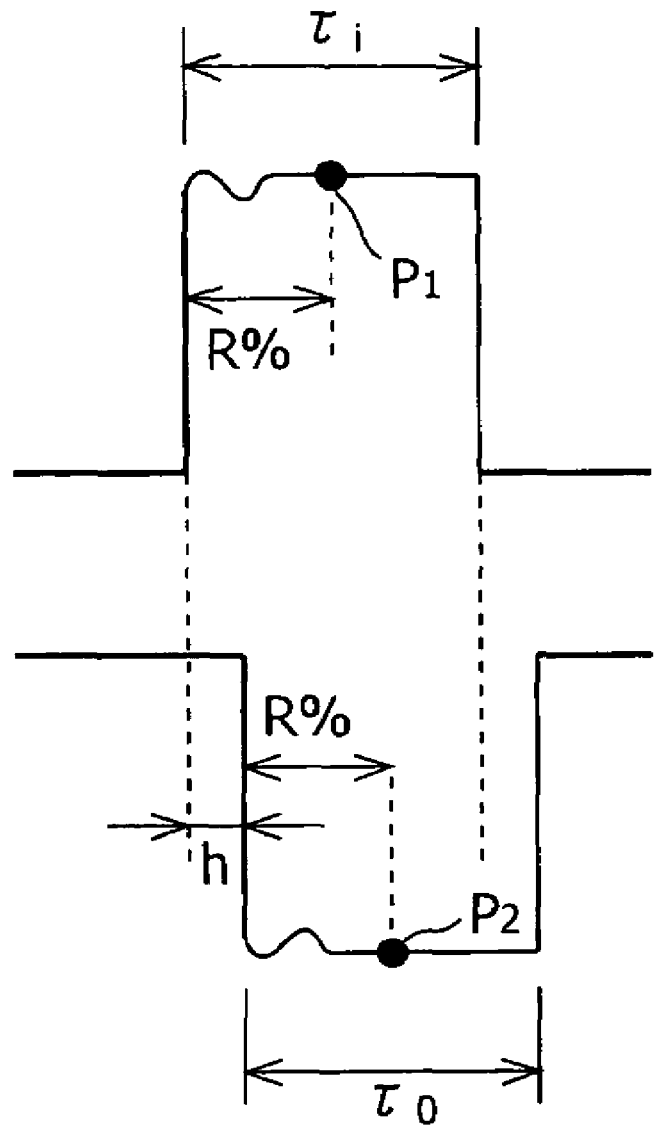
FIG. 9 includes part (a) showing the waveform of a pulse input to the gate of a DUT and a voltage defining point set for the pulse and part (b) showing the waveform of a voltage pulse generated based on the drain current of the DUT and a voltage measuring point set for the pulse.

In some cases, pulses having somewhat distorted waveforms, such as waveforms with overshoot and undershoot, are input to the gate of the DUT 1, due to the characteristics of the pulse generator 3, the frequency characteristics of the cable connected to the output of the pulse generator 3, the characteristics of the DUT 1, and so on. Part (a) of FIG. 9 illustrates a gate input pulse having such a distorted waveform. When the input pulse is distorted in this manner, the waveform of an output pulse corresponding to the drain voltage measured by the oscilloscope 9 is also distorted with a delay h, as shown in part (b) of FIG. 9. Such an input/output pulse varies in voltage, depending on the position along the time axis, and thus becomes a cause of measurement error.

Accordingly, in this embodiment, in order to define the timing of a voltage value of the input/output pulse, a pulse applied to the gate of the DUT 1 is input to the oscilloscope 9 and the computer 11 executes processing for setting a voltage-defining point $P_1$ corresponding to a pulse width τi of the input pulse. The point $P_1$ is set at a spot that is shifted from the leading edge of the input pulse toward the trailing edge by a ratio R % of the pulse width $τ_i$ (R % is an arbitrary value in the range of, e.g., 50% to 90%). The point $P_1$ is used for the measurement timing of a pulse voltage output from the pulse generator 3 and a pulse voltage output from the AC output terminal of the bias tee 5.

For actual measurement of an output characteristic of the DUT 1, since the aforementioned gate input pulse is applied to the gate of the DUT 1, a voltage pulse (as shown in part (b) in FIG. 9) corresponding to the drain current is input to the oscilloscope 9.

Thus, the computer 11 reads the waveform of the voltage pulse from the oscilloscope 9 and measures a pulse width $\tau_o$ thereof. Further, the computer 11 sets a timing point $P_2$, shifted from the leading edge of the voltage pulse toward the trailing edge by the ratio R % of the pulse width $\tau_o$, as a voltage measurement point.

Consequently, the relationship between the point $P_1$ set for the gate input pulse and the point $P_2$ set for the voltage pulse input to the oscilloscope 9 is established. Thus, the computer 11 samples the voltage at the point $P_2$ for the voltage pulse, as a voltage indicating the drain current of the DUT 1.

As described above, according to this embodiment, since the relationship between the point $P_1$ for the gate input pulse and the point $P_2$ for the voltage pulse corresponding to the drain current is maintained even in the presence of the distortion, the measurement accuracy of the output characteristic of the DUT 1 is improved.

While the embodiment of the present invention has been described above, it is apparent to those skilled in the art that various changes and modifications can be made thereto. For example, the number n of repetitions determined in step 213 in FIG. 8 may be a number other than 3. Various voltage values that produce, across the setting voltage $V_{set}$, a voltage difference equal to or greater than the resolution can be used as the upper limit value and the lower limit value for calibrating $V_{set}$ of the pulse generator 3.

The invention claimed is:

1. A field-effect-transistor characteristic measuring method in which a predetermined bias voltage output from an output terminal of a bias tee is applied to a drain of a field-effect transistor; a pulse output from a pulse generator is applied to a gate of the field-effect transistor to thereby cause drain current to be generated in the field-effect transistor; the drain current is converted into a voltage pulse by a load impedance connected to an alternating-current output terminal of the bias tee; and the drain current is measured based on the voltage pulse, the method comprising the steps of:

increasing the bias voltage by an amount corresponding to a voltage drop caused by the load impedance and repeating measurement of the voltage pulse a predetermined number of times, while the voltage pulse changes in response to an increase in the bias voltage; and applying extrapolation to the last two measured values of the voltage pulse obtained by the predetermined number of repeated measurements to determine a drain voltage to be applied to the field-effect transistor.

2. The method according to claim 1, wherein the pulse output from the pulse generator is applied to the field-effect transistor via an attenuator.

3. The method according to claim 1, wherein the pulse generator outputs voltages having the same value for various voltage settings included in the same output-voltage-setting range (r–a, r–b, . . . ) due to an error associated with the resolution of voltage setting, the method further comprising the steps of:

setting a lower limit voltage and an upper limit voltage for the pulse to be applied to the gate of the field-effect transistor, with the lower limit voltage being a minimum voltage ($V_{set}$-L) in a first setting range including a desired set pulse voltage ($V_{set}$-K) and the upper limit voltage being a minimum voltage ($V_{set}$-H) in a second set range adjacent to a maximum voltage in the first setting range;

measuring the drain current based on a pulse having the upper limit voltage and the drain current based on a pulse having the lower limit voltage; and computing, by interpolation, a drain current corresponding to a drain current based on the desired set pulse voltage ($V_{set}$-K), in accordance with the desired set pulse voltage ($V_{set}$-K) and each measured drain current.

4. The method according to claim 1, further comprising the steps of:

measuring a width of the pulse applied to the gate of the field-effect transistor;

adjusting pulse-voltage-defining timing of the applied pulse to timing shifted from a leading edge of the applied pulse toward a trailing edge thereof in a width direction by a predetermined ratio;

measuring a width of the voltage pulse;

setting voltage-detection timing of the voltage pulse to timing shifted from a leading edge of the voltage pulse toward a trailing edge thereof by an amount corresponding to the predetermined ratio of the width of the voltage pulse; and measuring a voltage of the voltage pulse at the voltage-detection timing.

* * * * *